(12) United States Patent
Melkonyan

(10) Patent No.: US 10,931,271 B2
(45) Date of Patent: Feb. 23, 2021

(54) CIRCUIT ARRANGEMENT AND METHOD FOR CONTROLLING A POWER SEMICONDUCTOR SWITCH

(71) Applicant: Siemens Aktiengesellschaft, Munich (DE)

(72) Inventor: Ashot Melkonyan, Munich (DE)

(73) Assignee: SIEMENS AKTIENGESELLSCHAFT, Munich (DE)

(*) Notice: Subject to any disclaimer, the term of this patent is extended or adjusted under 35 U.S.C. 154(b) by 0 days.

(21) Appl. No.: 16/864,455

(22) Filed: May 1, 2020

(65) Prior Publication Data

US 2020/0350904 A1    Nov. 5, 2020

(30) Foreign Application Priority Data

May 2, 2019   (EP) .................................. 19172183

(51) Int. Cl.
*H03K 17/0812* (2006.01)
*H03K 17/08* (2006.01)

(52) U.S. Cl.
CPC .......... *H03K 17/08122* (2013.01); *H03K 2017/0806* (2013.01)

(58) Field of Classification Search
None
See application file for complete search history.

(56) References Cited

U.S. PATENT DOCUMENTS

| | | | | |
|---|---|---|---|---|
| 4,039,928 A | * | 8/1977 | Noftsker | H02M 7/1557 323/326 |
| 7,988,354 B2 | * | 8/2011 | Jansen | G01K 7/16 374/170 |
| 2008/0272828 A1 | | 11/2008 | Min | 327/512 |

FOREIGN PATENT DOCUMENTS

WO   2015/128360 A1   9/2015   ............... G01K 7/01

OTHER PUBLICATIONS

Extended European Search Report, Application No. 19172183.6, 5 pages, dated Oct. 23, 2019.

* cited by examiner

*Primary Examiner* — Jeffery S Zweizig
(74) *Attorney, Agent, or Firm* — Slayden Grubert Beard PLLC

(57) ABSTRACT

Various embodiments include a circuit arrangement for controlling a power semiconductor switch including a gate terminal, a source terminal, a drain terminal, and a conduction channel between the source and drain terminals, comprising: a controller for generating a control signal to alternate the semiconductor switch between a turned-on state and a turned-off state; a current source for injecting a current into the gate terminal; and an evaluation unit. The evaluation unit measures a voltage between the gate terminal and one of the source terminal and drain terminal while the semiconductor switch is in the turned-on state; and determines from the measured voltage and the current an absolute temperature of the semiconductor switch.

12 Claims, 1 Drawing Sheet

CIRCUIT ARRANGEMENT AND METHOD FOR CONTROLLING A POWER SEMICONDUCTOR SWITCH

CROSS-REFERENCE TO RELATED APPLICATIONS

This application claims priority to EP Patent Application No. 19172183.6, filed on May 2, 2019. The contents of the aforesaid application are incorporated herein for all purposes.

TECHNICAL FIELD

The present disclosure relates to power circuits. Various embodiments may include circuit arrangements and/or methods for driving a power semiconductor switching element, such as a SiC JFET or a GaN HEMI switch, the switch comprising a source terminal and a drain terminal and a conduction channel formed between these terminals depending on a voltage applied at a gate terminal.

BACKGROUND

Semiconductor switching elements are used for example as power switching elements. There is a need to monitor the temperature of the semiconductor switching element to ensure the safe operation of the semiconductor switching element and a module that contains the switching element. When the temperature of the switching element becomes too high the circuit driving this switching element may ensure a safe shutdown procedure.

Typically, a power semiconductor module employs temperature sensors such as NTC (negative temperature coefficient) temperature sensors to find the temperature of a switching element. The temperature sensors are typically arranged on a carrier plate (base plate) on which the semiconductor switching element is also arranged. Alternatively, the temperature sensors may be arranged directly on a heat sink near the semiconductor switching element. In both cases the temperature measurement is associated with an uncertainty which is mainly due to the thermal capacity of the carrier plate or heat sink and the thermal behavior. The time constant of the thermal inertia reduces the reaction rate of the associated temperature monitoring circuit. This can lead to a dynamic overheating of the module and even to a thermal failure.

SUMMARY

The teachings of the present disclosure provide circuit arrangements and methods for driving a semiconductor switching element which allow a precise and immediate determination of the temperature of the semiconductor switching element. For example, some embodiments include a circuit arrangement (20) for controlling a power semiconductor switch (10), the switch (10) comprising a gate terminal (G), a source terminal (S) and a drain terminal (D) with a conduction channel being formed between the source and drain terminals (S, D), the circuit arrangement (20) comprising: means for generating a control signal by which the semiconductor switch (10) is alternated between a turned-on state and a turned-off state; a current source (25) for injecting a current into the gate terminal (G); and an evaluation unit arranged to: measure the voltage between the gate terminal (G) and one of the source terminal and drain terminal (S, D) while the semiconductor switch (10) is in the turned-on state, and determine from the measured voltage and the current from the current source (25) the absolute temperature of the semiconductor switch (10).

In some embodiments, the power semiconductor switch (10) is a wide-bandgap switch (10), particularly a SiC-based or GaN-based power semiconductor switch (10).

In some embodiments, the power semiconductor switch (10) is a JFET device or a HEMT device (10).

In some embodiments, the current source (25) is configured to provide a constant current.

In some embodiments, the means for generating a control signal comprise a microprocessor (28) arranged to generate a pulse width modulation signal for controlling the semiconductor switch (10).

In some embodiments, there is a unit for detection whether the semiconductor switch (10) is in a turned-on state.

In some embodiments, the evaluation unit is further arranged to determine the source-drain current flowing in the power semiconductor switch (10) from the temperature.

In some embodiments, the evaluation unit is further arranged to determine the presence of an overcurrent flowing in the power semiconductor switch (10) from the temperature.

In some embodiments, the evaluation unit is arranged to determine an ambient temperature of the power semiconductor switch (10) and use the ambient temperature in determining the source-drain current.

As another example, some embodiments include a method for controlling a power semiconductor switch (10), the switch comprising a gate terminal (G), a source terminal (S) and a drain terminal (D) with a conduction channel being formed between the source and drain terminals (S, D), comprising the steps: generating a control signal by which the power semiconductor switch (10) is alternated between a turned-on state and a turned-off state; with a current source (25), generating a current into the gate terminal (G); measuring the voltage between the gate terminal (G) and one of the source terminal (S) and drain terminal (D) while the semiconductor switch (10) is in the turned-on state, and determining from the measured voltage and the current from the current source (25) the absolute temperature of the semiconductor switch (10).

In some embodiments, a constant current is generated with the current source (25).

In some embodiments, a source-drain current of the power semiconductor switch (10) is determined from the measured voltage.

BRIEF DESCRIPTION OF THE DRAWINGS

Embodiments of the teachings of the present disclosure are described below with reference to the accompanying drawings to which the scope of the teachings is not limited. The illustrations of the drawings are in schematic form. Similar or identical elements use the same reference signs throughout the figures.

DETAILED DESCRIPTION

Figure 1:
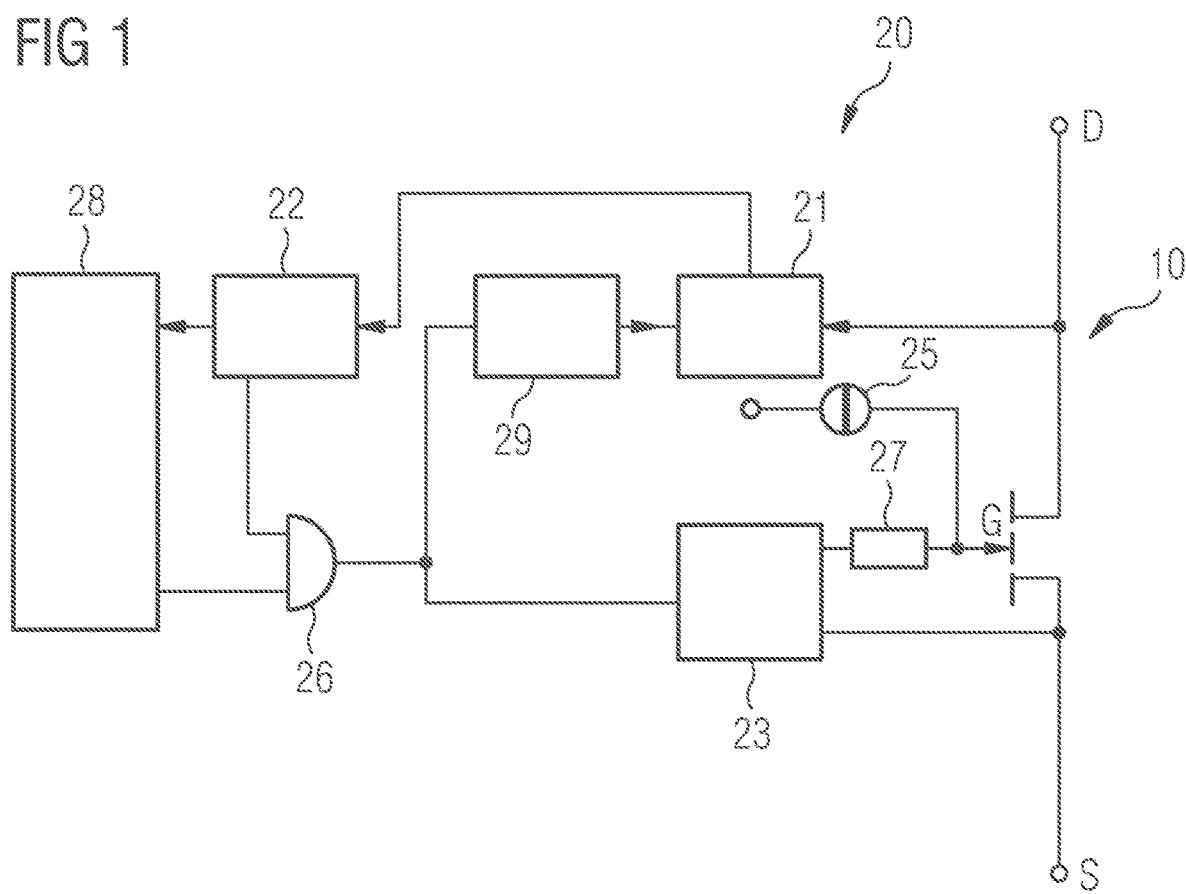
FIG. 1 gives a schematic representation of an example circuit arrangement for driving a GaN-based HEMT transistor which allows determining the temperature of the semiconductor incorporating teachings of the present disclosure.

The present disclosure describes circuit arrangements for controlling a power semiconductor switching element, the switching element comprising a gate terminal, a source terminal and a drain terminal with a conduction channel being formed between the source and drain terminals. The circuit arrangement comprises means for generating a control signal by which the semiconductor switch is alternated between a turned-on state and a turned-off state. The circuit arrangement further comprises a current source for generating a current into the gate terminal and an evaluation unit arranged to measure the voltage between the gate terminal and one of the source and drain terminal while the semiconductor switching element is in the turned-on state and further arranged to determine from the measured voltage and the current from the current source the absolute temperature of the semiconductor switch.

One example method incorporating teachings of the present disclosure for controlling a power semiconductor switch, the switch comprising a gate terminal, a source terminal and a drain terminal with a conduction channel being formed between the source and drain terminals, comprises the steps: generating a control signal by which the semiconductor switch is alternated between a turned-on state and a turned-off state; with a current source, generating a DC current into the gate terminal; measuring the voltage between the gate terminal and one of the source terminal and drain terminal while the semiconductor switch is in the turned-on state; and determining from the measured voltage and the current from the current source the absolute temperature of the semiconductor switch.

In some embodiments, a junction between the gate and source/drain terminals that can carry current and exhibits a threshold voltage, e.g. a p-n junction or a Schottky junction, may be employed to determine the temperature of the transistor element. Some embodiments use the temperature dependence of this junction's I-V characteristic. When the voltage between the gate and source terminals exceeds a threshold voltage level of ca. 7 V-8 V the space charge region penetrates the barrier region and reaches the AlGaN barrier layer. Then the intrinsic gate diode becomes positively biased and starts to conduct a let-trough current.

In some embodiments, a current source injects the small DC sensing current flowing through the gate diode just after switching the switching element into the ON state. This limits currents being supplied by the gate driver circuit when exceeding the threshold voltage level. The current source may be a resistor of high resistance. With the current being set by the current source the voltage over the gate-source diode is measured and the temperature is determined from the measured voltage.

In some embodiments, there is a direct highly dynamic and precise temperature measurement of the power switching element. The measurement is independent from the current flowing through the channel of the semiconductor switching element. In other words, the temperature measurement can be made during operation of the switching element. Since the temperature is not measured at the heat sink or a base plate but instead directly at the semiconductor switching element itself, there is no thermal capacity leading to a measurement lag and no heat spreading leading to false measurement values. This allows precise control of the switching element and fast reactions to over-temperature.

Various embodiments of the teachings herein may incorporate one or more of the following features. The power semiconductor switch may be a wide-bandgap switch, particularly a SiC-based or GaN-based power semiconductor switch. The power semiconductor switch may be a JFET device or a HEMT device. The current source may be configured to provide a constant current. The temperature can then be directly determined from the measured voltage over the gate diode. The means for generating a control signal may comprise a microprocessor arranged to generate a pulse width modulation signal for controlling the semiconductor switch. This is typical of operation of a half-bridge in a power converter. The circuit arrangement may comprise a unit for detection whether the semiconductor switch is in a turned-on state.

In some embodiments, the evaluation unit may be further arranged to determine the source-drain current flowing in the power semiconductor switch from the temperature or the determined voltage. This recognizes that the source-drain current, i.e. the main current flowing in the switch heats up the switch and is thus directly responsible for an elevated temperature of the switch. Thus, the source-drain current can be deduced from the measured temperature or the measured voltage. This is possible specifically because the temperature measurement happens directly within the power semiconductor switch and thus has a very low reaction time. This contrasts with an external temperature measurement of the switch which is subject to the thermal mass and thermal resistance surrounding the switch and will therefore typically be far too slow to allow, e.g., a timely reaction to an overcurrent.

In some embodiments, the evaluation unit may be arranged to deduce if a critical current, i.e. an overcurrent is present between source and drain terminal from the measured temperature or the measured voltage. In some embodiments, the evaluation unit may be arranged to determine an ambient temperature of the power semiconductor switch and use the ambient temperature in determining the source-drain current. In this way the effect of different ambient temperatures such as 10° C. or 30° C. can be considered in determining the source-drain current for increased precision.

FIG. 1 shows an example embodiment of a circuit arrangement 20 incorporating teachings of the present disclosure for driving a GaN-based high electron mobility transistor 10. The GaN HEMT device 10 includes a control terminal G (gate) and a first main terminal D (drain) and a second main terminal S (Source). When the GaN HEMT device 10 is turned on, a channel is formed between the first main terminal D and the second main terminal S through which a current can flow. The control terminal G of the GaN HEMT device 10 is connected to a region of n-type conductivity formed from AlGaN (aluminum gallium nitride), forming a Schottky barrier which behaves as a diode.

The circuit arrangement 20 described hereinafter allows determining the temperature of the aforementioned Schottky diode, that is, the gate-source diode, and thus the temperature of the whole GaN HEMT device 10. The temperature can be determined during operation of the semiconductor switching element.

The circuit arrangement 20 comprises a unit 21 for detection of a desaturation, a fault memory 22, a unit 23 for signal detection and evaluation, a constant current source 25, a logic gate 26 and a drive signal generating microprocessor 28. The drive signal is a pulse-width modulated signal (PWM signal) which is routed through the logic gate 26 and the unit 23 for signal detection and evaluation to the gate terminal G. The PWM signal from microprocessor 28 switches the GaN HEMT device 10 alternately on and off. The conduction state of the GaN HEMT device 10 alternates according to the PWM signal. A second input of the logic gate 26 is an output of fault memory 22. The constant current source 25 is connect to a supply voltage.

The unit 23 for signal detection and evaluation is connected between the control terminal G and the second main terminal S. The unit 23 detects the voltage across the gate-source diode. In some embodiments, it may detect the current flowing into or out of the gate. Resistor 27 is provided for current detection in the circuit.

The unit 21 for detection of a desaturation is connected to the first main terminal D, i.e. the drain terminal. Unit 21 is used to detect the current conduction state of the GaN HEMT device 10, i.e. whether the GaN HEMT device 10 is currently conducting or blocking current. Unit 21 for the detection of desaturation is connected to the fault memory 22.

When a fault occurs, an error signal is fed to gate 26, so that the output of gate 26 ensures a blocking state of GaN HEMT device 10. The unit 29 for blocking overcurrent peaks ("blanking time") also receives the output of gate 26. The unit 29 is used to block current peaks, for example during current commutation. On the output side, unit 29 is connected to unit 21.

The circuit shown in FIG. 1 is a typical driver circuit for a transistor except for the constant current source 25 and the unit 23 for signal detection and evaluation which are not typically part of a driver circuit. Constant current source 25 may be a resistor while the unit 23 for signal detection and evaluation may be provided as an operational amplifier circuit.

During operation of the GaN HEMT device 10 and when the GaN HEMT device 10 is in a conductive state, i.e. is turned on, the unit 23 for signal detection and evaluation can measure the voltage across the gate-source diode. The current through the diode is equal to the current supplied by the constant current source 25 and may be e.g. 1 mA or 1.5 mA. The measured voltage is therefore a direct measure of the temperature shift of the IV characteristic of the gate-source diode. A higher temperature will yield a lower voltage at the current of the constant current source 25.

Figure 2:
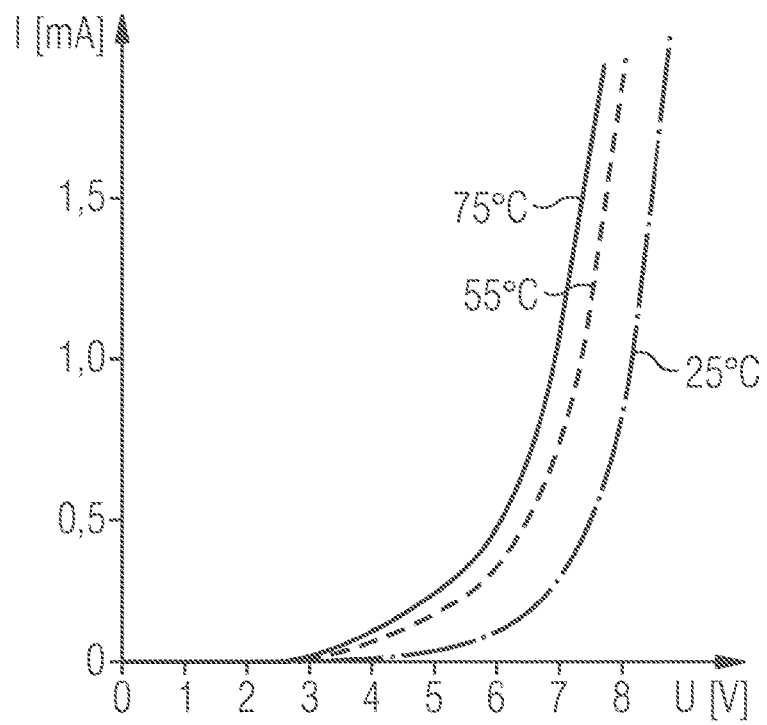
FIG. 2 illustrates a typical characteristic of the gate current versus the gate-source voltage.

FIG. 2 illustrates a diagram showing the (positive) gate current $I_g$ as a function of the gate-source voltage $V_{gs}$ of a GaN-HEMT. In the diagram, three experimentally determined IV-curves as a function of temperature are shown. It may be seen that for higher temperatures at the pn junction the current through the gate diode increases for a given voltage. When the current is held constant through the current source, the voltage decreases with rising temperature. In the IV-curves of FIG. 2, the voltage difference at a current of 1 mA between temperatures of 25° C. and 55° C. is ca. 800 mV while the voltage difference at a current of 1 mA between temperatures of 25° C. and 75° C. is ca. 1000 mV.

This means that unit 23 for voltage detection and evaluation may deduce the temperature of the gate diode and thus of the GaN HEMT device 10 by a simple comparison of a measured voltage with values stored in a memory. This can be done with precision and a virtually non-existent time delay. Thus an overtemperature shutdown of a module containing the GaN HEMT device 10 can be prevented. The method can be used to determine the reliability, the aging behavior and the remaining lifetime of the GaN HEMT device 10.

LIST OF REFERENCE NUMERALS

10 GaN HEMI device
20 Circuit arrangement
21 Unit for the detection of desaturation
22 Fault memory
23 Unit for voltage detection and evaluation
25 Constant current source
26 Logic gate
27 Resistor
28 Microprocessor
29 Unit for blocking overcurrent peaks
G Gate terminal
S Source terminal
D Drain terminal

The invention claimed is:

1. A circuit arrangement for controlling a power semiconductor switch including a gate terminal, a source terminal, a drain terminal, and a conduction channel between the source and drain terminals, the circuit arrangement comprising:
a controller for generating a control signal to alternate the semiconductor switch between a turned-on state and a turned-off state;
a current source for injecting a current into the gate terminal; and
an evaluation unit configured to:
measure a voltage between the gate terminal and one of the source terminal and drain terminal while the semiconductor switch is in the turned-on state; and
determine from the measured voltage and the current an absolute temperature of the semiconductor switch.

2. The circuit arrangement of claim 1, wherein the power semiconductor switch comprises a wide-bandgap switch.

3. The circuit arrangement of claim 1, wherein the power semiconductor switch comprises at least one of a JFET device or a HEMT device.

4. The circuit arrangement of claim 1, wherein the current source provides a constant current.

5. The circuit arrangement claim 1, wherein the controller comprises a microprocessor arranged to generate a pulse width modulation signal for controlling the semiconductor switch.

6. The circuit arrangement of claim 1, further comprising a monitor for detecting whether the semiconductor switch is in the turned-on state.

7. The circuit arrangement of claim 1, wherein the evaluation unit determines a value for a source-drain current flowing in the power semiconductor switch based at least in part on the absolute temperature.

8. The circuit arrangement of claim 1, wherein the evaluation unit identifies an overcurrent flowing in the power semiconductor switch based at least in part on the absolute temperature.

9. The circuit arrangement of claim 7, wherein the evaluation unit determines an ambient temperature of the power semiconductor switch and uses the ambient temperature to determine the source-drain current.

10. A method for controlling a power semiconductor switch including a gate terminal, a source terminal, a drain terminal, and a conduction channel between the source and drain terminals, the method comprising:
generating a control signal by which the power semiconductor switch is alternated between a turned-on state and a turned-off state;
generating a current to the gate terminal using a current source;
measuring a voltage between the gate terminal and one of the source terminal and drain terminal while the semiconductor switch is in the turned-on state; and
determining an absolute temperature of the semiconductor switch using the measured voltage and the current from the current source.

11. The method of claim 10, wherein the current source generates a constant current.

12. The method of claim 10, further comprising determining a source-drain current of the power semiconductor switch based at least in part on the measured voltage.

\* \* \* \* \*